(12) United States Patent
Amir

(10) Patent No.: US 10,701,803 B2
(45) Date of Patent: Jun. 30, 2020

(54) MONITORING CIRCUITRY

(71) Applicant: HP INDIGO B.V., Amstelveen (NL)

(72) Inventor: Gideon Amir, Ness Ziona (IL)

(73) Assignee: HP Indigo B.V., Amstelveen (NL)

( * ) Notice: Subject to any disclaimer, the term of this patent is extended or adjusted under 35 U.S.C. 154(b) by 0 days.

(21) Appl. No.: 16/098,175

(22) PCT Filed: Jul. 19, 2016

(86) PCT No.: PCT/EP2016/067204
§ 371 (c)(1),
(2) Date: Nov. 1, 2018

(87) PCT Pub. No.: WO2018/014942
PCT Pub. Date: Jan. 25, 2018

(65) Prior Publication Data
US 2019/0150280 A1 May 16, 2019

(51) Int. Cl.
H05K 1/09 (2006.01)
H05K 1/02 (2006.01)
(Continued)

(52) U.S. Cl.
CPC .............. *H05K 1/092* (2013.01); *A61J 1/035* (2013.01); *A61J 7/0436* (2015.05); *G01R 27/2605* (2013.01); *H05K 1/0275* (2013.01); *H05K 1/0293* (2013.01); *H05K 1/0386* (2013.01); *H05K 1/0393* (2013.01); *H05K 1/162* (2013.01);
(Continued)

(58) Field of Classification Search
CPC .... H05K 1/092; H05K 1/0275; H05K 1/0293; H05K 1/0386; H05K 1/162; H05K 1/167; H05K 2201/0284; H05K 2201/0323; H05K 2201/09127; H05K 2203/175;
(Continued)

(56) References Cited

U.S. PATENT DOCUMENTS

| 8,120,492 B2 | 2/2012 | Scharfeld et al. |
| 8,960,440 B1 * | 2/2015 | Kronberg ................ A61J 1/035 |
| | | 206/531 |

(Continued)

FOREIGN PATENT DOCUMENTS

| WO | WO-2006023294 | 3/2006 |
| WO | WO-2006076806 | 7/2006 |

(Continued)

OTHER PUBLICATIONS

Graddage, N. et al., "Manufacturability of a Printed Resistance-based Multiplexing Scheme for Smart Drug Packaging", 2016, < http://ieeexplore.ieee.org/xpl/articleDetails.jsp?reload=true&arnumber=7393819>.

*Primary Examiner* — Roshn K Varghese
(74) *Attorney, Agent, or Firm* — Middleton Reutlinger

(57) ABSTRACT

In an example, monitoring circuitry includes a first and second coupling, at least one of which is to capacitively couple the monitoring circuitry to a monitored circuit on a product packaging. The monitored circuit has a resistance which is indicative of a status of a product stored in the product packaging, and the monitored circuit is to be connected in series between the first coupling and the second coupling. The monitoring apparatus may determine the resistance of the monitored circuit via the first and second couplings.

8 Claims, 4 Drawing Sheets

(51) Int. Cl.
*A61J 1/03* (2006.01)
*H05K 1/03* (2006.01)
*H05K 1/16* (2006.01)
*A61J 7/04* (2006.01)
*G01R 27/26* (2006.01)
*G01R 27/02* (2006.01)
*H05K 3/28* (2006.01)

(52) U.S. Cl.
CPC .............. *H05K 1/167* (2013.01); *G01R 27/02* (2013.01); *H05K 3/28* (2013.01); *H05K 3/281* (2013.01); *H05K 2201/0284* (2013.01); *H05K 2201/0323* (2013.01); *H05K 2201/0999* (2013.01); *H05K 2201/09127* (2013.01); *H05K 2203/175* (2013.01)

(58) Field of Classification Search
CPC ........ A61J 7/0436; A61J 7/0481; A61J 1/035; G01R 27/2605; G01R 27/205; G01R 31/026
See application file for complete search history.

(56) References Cited

U.S. PATENT DOCUMENTS

| | | |
|---|---|---|
| 9,101,530 B2 | 8/2015 | Wilson et al. |
| 2005/0284789 A1* | 12/2005 | Carespodi ............... B32B 15/08 206/461 |
| 2010/0089789 A1* | 4/2010 | Rosenbaum ............ A61J 1/035 174/250 |
| 2013/0285681 A1 | 10/2013 | Wilson et al. |
| 2014/0218057 A1* | 8/2014 | White ................... G06F 3/0414 324/686 |
| 2014/0253032 A1* | 9/2014 | Bruwer ................... H02M 1/36 320/108 |
| 2015/0249059 A1* | 9/2015 | Maijala ................. A61J 1/035 257/664 |
| 2015/0352010 A1 | 12/2015 | Simpson et al. |
| 2016/0103085 A1* | 4/2016 | Mehregany .............. H05K 7/02 324/71.1 |

FOREIGN PATENT DOCUMENTS

| | | |
|---|---|---|
| WO | WO-2013096880 | 6/2013 |
| WO | WO-2013159198 | 10/2013 |
| WO | WO-2014044918 | 3/2014 |

\* cited by examiner

MONITORING CIRCUITRY

BACKGROUND

Monitoring circuitry may be used to monitor the status of a monitored circuit. For example, monitoring circuitry may be used in conjunction with 'smart packages'. Smart packages are packages which are capable of performing functions in addition to containing products. For example they may comprise security functions, or provide verification of a product's source or the like. In some examples, smart packages may be monitored to determine if the interior of a storage volume has been accessed.

BRIEF DESCRIPTION OF DRAWINGS

Examples will now be described, by way of non-limiting example, with reference to the accompanying drawings, in which.

DETAILED DESCRIPTION

Figure 1A:
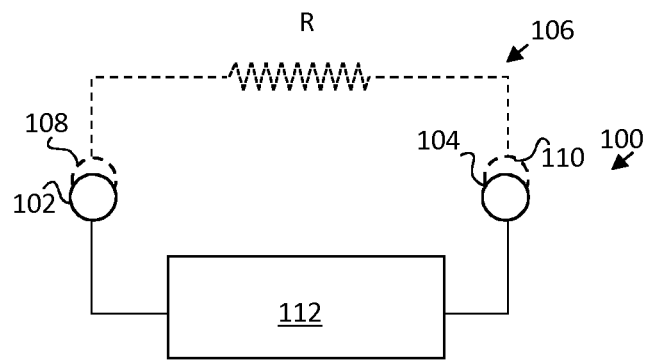
FIG. 1A is a simplified schematic diagram of example monitoring circuitry.

In the drawings, where it aids clarity, like parts are labelled with like numbers.

FIG. 1A is a schematic diagram of example monitoring circuitry 100 comprising a first coupling 102 and a second coupling 104, the first and second couplings 102, 104 being to electrically couple the monitoring circuitry to a monitored circuit 106 (shown in dotted line) having a resistance R which is provided on a product packaging. At least one electrical coupling to be formed between the monitored circuit 106 and the monitoring circuitry 100 is a capacitive coupling. The resistance R of the monitored circuit 106 is indicative of a status of the product, and the monitored circuit 106 is coupled to the monitoring circuitry 100 via, in this example, a first and second coupling pad 108, 110 of the monitored circuit, and at least one pad 108, 110 is to form, in use, a capacitive coupling to the first and second couplings 102, 104. At least one coupling pad 108, 110 may form, in effect, a respective plate of a parallel plate capacitor, with the corresponding first and/or second coupling 102, 104 providing an opposing plate.

In an example, the monitored circuit 106 may comprise a conductive track provided (for example, printed using conductive ink) on a product packaging. The track may be broken by accessing the interior of the packaging, changing the overall resistance of the monitored circuit 106. In some examples, this may be a change from a relatively low resistance (the resistance of the monitored track) to a high resistance (the resistance of an interrupted track). Each coupling pad 108, 110 may comprise at least one printed region of conductive ink. The conductive ink may for example comprise conductive particles such as metals or carbon. In some examples, as is discussed in greater detail below, the coupling pads 108, 110 may further comprise a dielectric layer, for example printed or otherwise applied to the pad 108, 110. In some examples, the monitored circuit 106 may comprises a plurality of such tracks which are interlinked to form the monitored circuit 106 and breaking one track may change the resistance of the monitored circuit 106. In other examples, the resistance of each track of the plurality of tracks may be monitored.

In one example, the packaging may comprise a blister pack for dispensing medication and a plurality of tracks may be provided, one track associated with each 'blister'. When the blister is broken to dispense a pill, the track (which may be printed on a frangible substrate such as paper or the like) may be broken and thus the resistance associated with the circuit increases (in some examples, becoming very high). Other package types may also comprise monitored storage volumes, for example, a track may run over a closure of a box or bag type container and be broken when the closure is opened. In some examples, the monitoring circuitry 100 may be removably coupled to such packaging.

The monitoring circuitry 100 comprises monitoring apparatus 112 to determine the resistance of the monitored circuit 106 via the couplings 102, 104. The monitoring apparatus 112 may for example comprise any, or any combination of, at least one current source, at least one voltage source, at least one voltmeter, at least one ammeter, at least one energy source (for example a battery or the like), at least one capacitance meter, or the like.

Figure 1B:
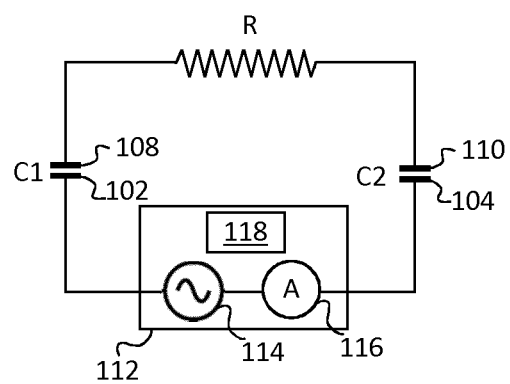
FIG. 1B shows an equivalent electric circuit of the example monitoring circuitry of FIG. 1A coupled with an example monitored circuit.

FIG. 1B shows a schematic representation of a circuit formed when an example monitoring circuitry 100 is coupled to a monitored circuit 106 such that two capacitive couplings C1 and C2 are formed. In this example, the monitoring apparatus 112 comprises an alternating voltage source 114, an ammeter 116 and processing circuitry 118. As can be seen, the monitored circuit 106 is connected in series between the capacitive couplings C1 and C2 formed between the monitored circuit 106 and the monitoring circuitry 100.

A capacitance C may be defined as the equivalent capacitance of both C1 and C2 couplings, wherein $1/C = 1/C1 + 1/C2$. As in this example, the monitored circuit 106 comprises no other capacitive elements, C is the capacitance of the monitored circuit 106.

If the capacitance C is known or could be determined, (which in this example comprises knowing or determining C1 and C2), and the resistance R can be determined using a number of equations.

In particular, the capacitive reactance Xc is related to the circuit capacitance by the relationship:

$$Xc = 1/(2\pi fC),$$

where f is the frequency of the applied AC voltage, and $$Xc = X_{C1} + X_{C2}$$

In addition, an impedance Z may be defined as the impedance measured by the monitoring apparatus 112, which includes both the monitored circuit resistance and the couplings reactance. The impedance may be determined by applying an AC voltage at frequency f to the circuit and determining the current:

$$Z = V/I$$

Impedance Z is related to resistance and capacitance by the relationship:

$$Z^2 = R^2 + X_C^2$$

Thus, if V, f and C are predetermined and I is measured, R may be calculated.

The capacitance of a parallel plate capacitor is based on a number of factors, including the separation of the plates, the extent of overlap of the plates, area of the plates, the condition of the plates and any dielectric and the like. In some examples, the capacitances may be known. For example, the surface area of the coupling pads 108, 110 and the couplings 102, 104 may be known or estimated, as may the extent of their overlap, their separation and the permittivity of any dielectric therebetween. This allows the capacitance C to be calculated or estimated.

However, in practice, the capacitance C (or the capacitances C1 and C2) may be unknown and/or may vary over time.

For example, the monitored circuit 106 may be provided on a package of a consumable product, and/or the monitoring circuitry 100 may be for use with a plurality of monitored circuits 106. Where the monitoring circuitry 100 is to be, for example, used in conjunction with a packaging, it may be clipped or secured thereto, but there may be at least some possibility of relative movement or misplacement, which may change an area of overlap of the 'plates' of the capacitive coupling(s). In other examples, at least one of the couplings 102, 104 or pads 108, 110 may be corroded, damage or misshapen, or there may be an air gap or a contaminant (for example, dust, grease or dirt) on top of an intended dielectric separation, or the dielectric may vary in properties (or change over time). Therefore, the capacitance of a capacitive coupling may vary from a nominal state.

If the actual capacitance/impedance could be determined and/or at least substantially negated, this may improve the accuracy with which the resistance R of the monitored circuit 106 could be determined.

In some examples set out herein, the monitoring apparatus 112 may be to acquire a plurality of electrical measurements and to use the plurality of electrical measurements to determine a value of the resistance R even if the capacitance of the coupled circuits (i.e. the monitoring circuitry 100 and the monitored circuit 106 when capacitively coupled) is at least initially unknown. This may increase the accuracy with which the resistance of a partially or wholly broken track may be determined. In some examples (see for example, FIG. 6 below), where a plurality of such tracks which are interlinked, this may allow a smaller difference in resistance to be determined, which may in turn increase the number or number of options for interlinking the tracks. Even in examples where each track is monitored individually, the resistance of a track may be high when the track is complete (i.e. unbroken) in order to reduce energy consumption (i.e. to keep current flow low). In such examples, the resistive difference between a whole and a broken or partially broken track may be small and therefore increasing the accuracy with which the resistance may be determined may assist in discrimination between a whole and broken (or partially broken) track.

In a first example now described with reference to the examples of FIG. 1A and FIG. 1B, the capacitance C is determined. While in some examples, this could be estimated based on the separation and overlap area of the pads 108, 110 and the couplings 102, 104 and the permittivity of a dielectric, in other examples, such as is set out below, the monitoring circuitry 100 may operate as a capacitance meter and determine the capacitance using electrical measurements.

In some examples, the capacitance of the combined circuit may be determined as follows. The alternating voltage source 114 may be used to provide an alternating current in the monitoring circuitry 100 and the monitored circuit 106 by supplying alternating current of a first and second frequency. The monitoring apparatus 112 is to measure the current (in this example, using the ammeter 116), and the determined current may be used by the processing circuitry 118, as outlined above, to determine the impedance Z at each frequency. A first impedance is an impedance of a circuit formed between the first coupling 102 and the second coupling 104 via the monitored circuit 106 when the voltage source 114 supplies voltage of the first frequency (f1). A second impedance is an impedance of a circuit formed between the first coupling 102 and the second coupling 104 via the monitored circuit 106 when the voltage source 114 supplies voltage of the second frequency (f2).

As has been stated above:

$$Xc = X_{C1} + X_{C2}, Xc = 1/(2\pi fC), \text{ and } Z^2 = R^2 + X_C^2$$

$X_C$ is therefore a function of the frequency and can be assessed and deducted using measurement in two frequency conditions:

$$X_{Cf1} = 1/(2\pi f1 C)$$

$$X_{Cf2} = 1/(2\pi f2 C)$$

$$Z_{f1}^2 = R^2 + (X_{Cf1})^2$$

$$Z_{f2}^2 = R^2 + (X_{Cf2})^2$$

The difference in impedances may be used to derive C, using the relationships:

$$Z_{diff}^2 = Z_{f1}^2 - Z_{f2}^2 = X_{Cf1}^2 - X_{Cf2}^2 = (1/2\pi C)^2 \times (1/f1^2 - 1/f2^2).$$

Thereafter, R may be calculated.

In another example, the capacitance could be measured using any other example of capacitance meter.

In another example, the impact of the value of the capacitance C is rendered minimal. In this example, the AC voltage source 114 supplies an alternating voltage of a variable frequency. In this example, the monitoring apparatus 112 is to determine, for each of a plurality of frequencies, an impedance Z of a circuit formed between the first coupling 102 and the second coupling 104 via the monitored circuit 106. The monitoring apparatus 112 determines a frequency threshold above which, for a predetermined frequency difference, the impedance differs by less than a predetermined amount and determines the resistance of the monitored circuit when a current of at least the threshold frequency is applied thereto.

This method makes use of the relationship, as stated above:

$$Xc = 1/(2\pi fC), Z^2 = R^2 + Xc^2$$

From this relationship, it may be noted that Xc decreases as the frequency increases, so if the frequency is high enough that Xc becomes negligible, determining the impedance is effectively the same as determining R.

For example, the frequency of the current may be increased, for example in a stepwise manner, until the difference between impedance measurements between frequency steps is within a threshold amount.

In another example, a first determination of impedance may be made at a high frequency, and a subsequent determination of impedance may be made at a lower frequency, and the difference between these values determined and compared to a threshold. This may allow a determination of whether the high frequency is high enough such that Xc is negligible (i.e. if the difference is within a threshold, the high frequency may be deemed to be 'high enough'). In some examples, this method may be employed initially and, if it is found that even the highest frequency available from a monitoring circuitry is not sufficiently high, another method, for example, a method of estimating or determining the capacitance directly as described above, may be employed.

In some examples now described, each coupling 102, 104 of the monitoring circuitry 100 comprises a plurality of galvanically separated connection elements.

Figure 2:
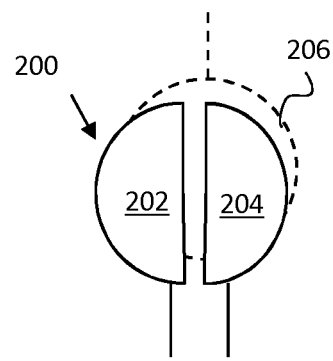
FIG. 2 is a simplified schematic diagram of an example coupling.

FIG. 2 shows an example of a coupling 200 which comprises two galvanically separated connection elements 202, 204, wherein the connection elements are to connect with a common coupling pad 206 (which is shown in dotted outline, and which could be either of coupling pad 108, 110) of the monitored circuit 106. These connection elements 202 are galvanically separated from one another, in the sense that there is no continuous electrical circuit formed via the connection elements 202, 204 within the monitoring circuitry 100. However, the connection elements 202, 204 may be electrically connected in use, for example via the common coupling pad 206 of the monitored circuit 106, so as to form part of a continuous circuit.

In an example, each coupling pad 206 may comprise a conductive region covering a spatial area. For example, the common coupling pad 206 may comprise a region of a substrate printed with conductive ink (and, in some examples, over printed with a dielectric). The substrate may for example comprise a plastic, metal, cardboard, paper or any other kind of substrate. In this example, each galvanically separated connection element 202, 204 is also a contact pad which may for example be formed of metal or any other conductive material and together the connection elements 202, 204 have a cross surface which is substantially similar to the surface area of the common coupling pad 206. The galvanically separated connection elements 202, 204 may be intended to be separated from the common coupling pad 206 by a dielectric, which may for example comprise a polymer layer, such as polyethylene (the relative permittivity of polyethylene is 2.25). Such a layer may be applied, for example printed, onto the substrate, overlying at least the coupling pad 206 (and in some examples providing a protective coating to a larger region of the substrate, for example to the whole surface thereof, or to at least the portions thereof bearing conductive tracks). Such a dielectric may for example be provided as a layer on top of the common coupling pad 206 on a substrate. This may protect the common coupling pad 206 from wear or damage. In other examples, the dielectric may comprises a different material, for example paper, Teflon and other plastics. In some examples, air could serve as a dielectric.

It may be noted that the capacitive coupling in this example is formed between 'plates' which may be formed, at least on the monitored circuit 106, of areas of ink. These areas may be of a size intended to provide a particular level of capacitance (bearing in mind that capacitance is proportional to the area of a plate in a parallel plate capacitor). In some examples, the coupling pads may be in the order of millimetres, or a few centimetres, in diameter.

Figure 3:
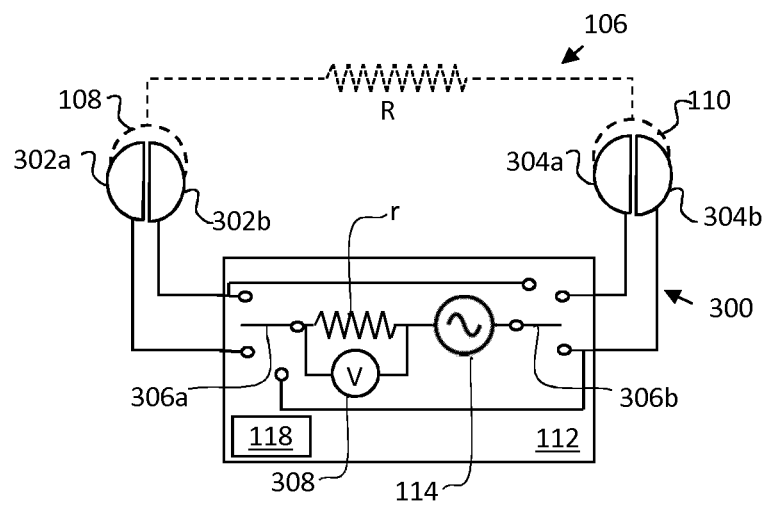
FIGS. 3 and 4 are simplified schematic diagrams of examples of monitoring circuitry.

FIG. 3 shows another example of monitoring circuitry 300 in which each of a first and second coupling comprises two galvanically separated connection elements 302a, 302b, 304a, 304b.

The galvanically separated connection elements 302a, 302b, 304a, 304b of each coupling are to capacitively couple with a coupling pad 108, 110 of the monitored circuit 106. In this example the monitoring apparatus 112 is to determine a number of impedance values.

The monitoring apparatus 112 in this example comprises a resistor r, an AC voltage source 114, a voltmeter 308, arranged to measure the voltage over the resistor r and processing circuitry 118. The resistance of resistor r is predetermined and constant (as it is part of the monitoring circuitry 100). The monitoring apparatus 112 also comprises two switches 306a, 306b, each of which can be independently controlled to connect with the connection elements 302a, 302b, 304a, 304b of each coupling. Each switch connects with two connection elements 302a, 302b of one coupling and one connection element 304a, 304b of the other coupling. In some examples, each switch may allow a connection with each element 302a, 302b, 304a, 304b.

The monitoring apparatus 112 may be used to measure the voltage on the resistor (Vr) (i.e. the voltmeter 308 and the resistor r are arranged to function as an ammeter).

The capacitive reactance of a capacitance C is defined by: $Xc=1/(2\pi fC)$

The total Impedance Z of an RC circuit is defined by: $Z^2=R^2+Xc^2$

The total capacitive reactance C of two capacitors (C1 and C2) in series is: $Xc=Xc1+Xc2$.

In this example six impedances are determined:

A first impedance of a circuit formed between the first and second connection elements of the first coupling via the common coupling pad 108 ($Z_{11-21}$) (i.e. a first switch 306a connects to one connection element 302a of the first coupling and the second switch 306b connects to the other connection element 302b of the first coupling);

a second impedance of a circuit formed between the first and second connection elements of the second coupling via the common coupling pad 110 ($Z_{12-22}$) (i.e. the first switch 306a connects to one connection element 304b of the second coupling and the second switch 306b connects to the other connection element 304a of the second coupling);

a third impedance of a circuit formed between the first connection element of the first coupling and the first connection element of the second coupling via the monitored circuit ($Z_{11-12}$) (i.e. the first switch 306a connects to the first connection element 302a of the first coupling and the second switch 306b connects to the first connection element 304a of the second coupling);

a fourth impedance of a circuit formed between the second connection element of the first coupling and second connection element of the second coupling via the monitored circuit ($Z_{21-22}$) (i.e. the first switch 306a connects to the second connection element 302b of the first coupling and the second switch 306b connects to the second connection element 304b of the second coupling);

a fifth impedance of a circuit formed between the first connection element of the first coupling and the second connection element of the second coupling via the monitored circuit ($Z_{11-22}$) (i.e. the first switch 306a connects to the first connection element 302a of the first coupling and the second switch 306b connects to the second connection element 304b of the second coupling); and a sixth impedance of a circuit formed between the second connection element of the first coupling and the first connection element of the second coupling via the monitored circuit ($Z_{21-12}$) (i.e. the first switch 306a connects to the second connection element 302b of the first coupling and the second switch 306b connects to the first connection element 304a of the second coupling).

In this example, there are four capacitances to consider. C1 is the capacitance of the coupling of first connection element 302a of the first coupling and the monitored circuit, C2 is the capacitance of the coupling of second connection element 302a of the first coupling and the monitored circuit 106, C3 is the capacitance of the coupling of first connection element 304a of the second coupling and the monitored circuit 106 and C4 is the capacitance of the coupling of second connection element 304b of the second coupling and the monitored circuit 106.

Noting that:

$$Z_{11-21}^2 = X_{C1}^2 + X_{C2}^2$$

$$Z_{12-22}^2 = X_{C3}^2 + X_{C4}^2$$

$$Z_{11-12}^2 = X_{C1}2 + X_{C3}^2 + R^2$$

$$Z_{11-22}^2 = X_{C1}^2 + X_{C4}^2 + R^2$$

$$Z_{21-12}^2 = X_{C2}^2 + X_{C3}^2 + R^2$$

$$Z_{21-22}^2 = X_{C2}^2 + X_{C4}^2 + R^2$$

Now R can be calculated as:

$$R^2 = ((Z_{11-12}^2 + Z_{11-22}^2 + Z_{21-12}^2 + Z_{21-22}^2)/2 - (Z_{11-21}^2 + Z_{12-22}^2))/2$$

Thus, the value of the capacitance of the couplings has no effect on the determination of R.

Figure 4:
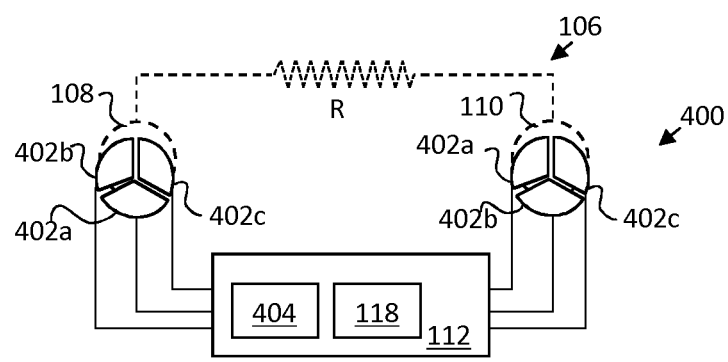

FIG. 4 shows an example of a monitoring circuitry 400 in which first and second couplings each comprise a first 402a, a second 402b and a third 402c connection element which are galvanically separated as set out above.

The monitoring apparatus 112 in this example comprises a capacitance measuring circuit 404 and processing circuitry 118. For examples, such a circuit 404 may be operated to charge a capacitor before allowing it to discharge, or may use a predetermined high-frequency alternating current through a capacitor and measuring the voltage across it, or other method may be used to measure a capacitance. In this example, the monitoring apparatus is connected in turn between pairs of connection elements of the same coupling. Thus, the resistor of the monitored circuit 106 is effectively removed from the circuit under test by being 'short circuited' by the common coupling pad 108, 110. As will be apparent, this allows the capacitance of each connection in isolation, and regardless of the components of the monitored circuit 106.

The monitoring apparatus 112 in this example determines:

a first capacitance, $C_{12}$, of a circuit formed between the first 402a and second connection elements 402b via the common coupling pad 108, 110;

a second capacitance, $C_{23}$, of a circuit formed between the second 402b and third connection element 402c via the common coupling pad 108, 110; and a third capacitance, $C_{13}$, of a circuit formed between a first 402a and third 402c connection element via the common coupling pad 108, 110.

The processing circuitry 118 uses the first, second and third capacitances $C_{12}$, $C_{23}$, $C_{13}$ to determine a connection capacitance between each connection element 402a-c of a coupling and the common coupling pad 206 of the monitored circuit 106. In this example, the capacitance between the first connection element 402a and the common coupling pad 206 is $C_1$, the capacitance between the second connection element 402b and the common coupling pad 206 is $C_2$ and the capacitance between the third connection element 402c and the common coupling pad 206 is $C_3$.

In this example, therefore:

$$1/C_{12} = 1/C_1 + 1/C_2$$

$$1/C_{23} = 1/C_2 + 1/C_3$$

$$1/C_{13} = 1/C_1 + 1/C_3$$

The assumption is that the resistance of the common coupling pad 108, 110 is negligible.

The monitoring apparatus 112 measures $C_{12}$, $C_{23}$, and $C_{13}$.

Now $C_1$, $C_2$ and $C_3$ can be calculated:

$$C_2 = 1/((1/C_{23} + 1/C_{12} - 1/C_{13})/2)$$

$$C_1 = 1/(1/C_{12} - 1/C_2)$$

$$C_3 = 1/(1/C_{13} - 1/C_1)$$

The capacitance of the other coupling may be determined in a similar manner.

Once the capacitances of the connections are determined, R may be determined as outlined above. In some examples, R may be determined via one connection element of each coupling 102, 104. However, the connection elements may be connected in parallel in which case the capacitance of the coupling is the sum of the connection elements of the elements so connected. This provides a higher capacitance, which in turn allows for easier discrimination between changes in the value of R.

Figure 5A:
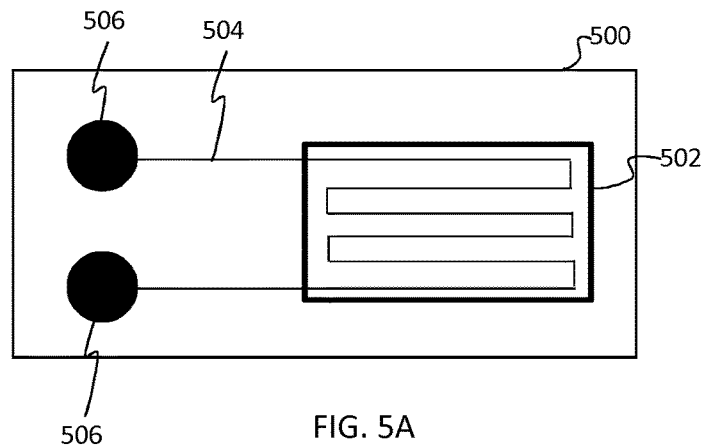
FIGS. 5A and 5B show an example packaging.
Figure 5B:
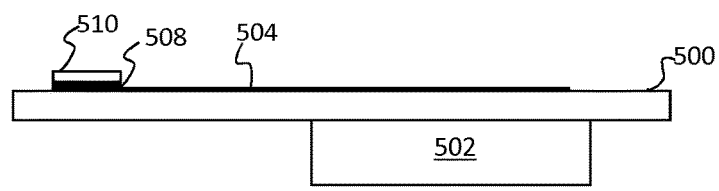

FIGS. 5A and 5B respectively show a plan and side view of example of packaging 500 comprising a storage volume 502 which comprises an interior, a monitoring track 504 and two coupling pads 506. The monitoring track 504 comprises conductive ink, and the coupling pads 506 comprise a first layer 508 of conductive ink and a second layer 510 of a dielectric material. When the interior of the storage volume 502 is accessed, the monitoring track 504 is interrupted. In this example, the monitoring track 504 comprises a serpentine configuration such that access to the interior of the storage volume 502 is prevented unless the track 504 is broken.

The second layer 510 may comprise a polymer. While the second layer 510 in this example is present in the region of the coupling pads 506, it could be provided over a greater area of the packaging, and in some examples over the monitoring track 504, which may protect the track 504 from damage. The thickness and relative thickness of the packaging 500, track 504 and layers 508, 510 as shown is intended purely as a schematic representation.

In some examples, track(s) 504 may be printed as part of a packaging manufacturing process, for example in line with any color printing of the packaging, for example to provide a particular visual effect, or to provide information. The example of the Figure is one example of packaging, other examples comprising bag-type packages, box-type packages, cartons, sachets, and many others.

Figure 6:
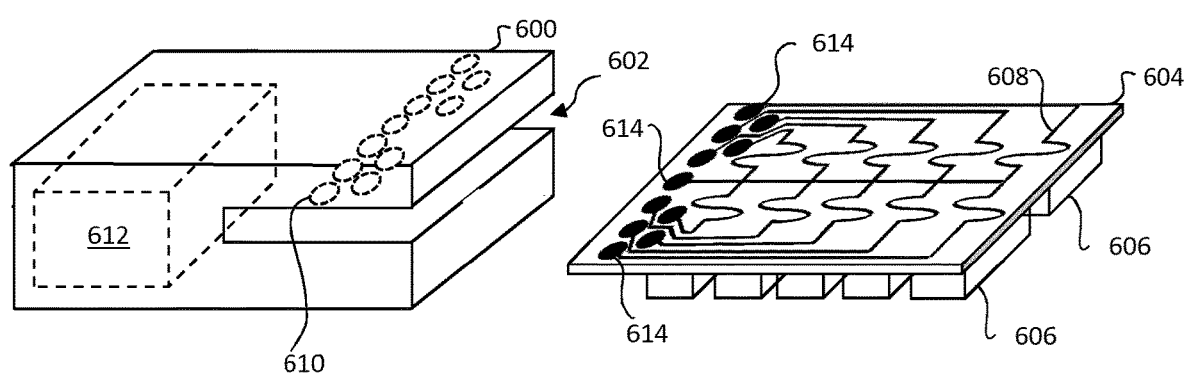
FIG. 6 is a simplified schematic diagram of example blister pack monitor.

FIG. 6 shows an example of monitoring circuitry and packaging. In this example, the packaging comprises a blister pack 604 and the monitoring circuitry comprises a blister pack monitor 600.

The blister pack 604 comprises at least one (in this example, ten) storage volumes 606 and at least one (in this example, ten) monitoring tracks 608 which are interrupted to provide access to an interior of the associated storage volume 606. For example, each storage volume 606 may initially house a pill or tablet, and be closed with a frangible, for example, paper-like, covering. The covering of each storage volume 606 may bear part of a conductive monitoring track 608 (which in some examples may be printed thereon using conductive ink), which in the example of the figure has a serpentine configuration to ensure that it is broken when the pill is accessed, although this need not be the case in all examples. The tracks 608 may initially have a relatively low resistance, this will become high (in some examples, very high) when the track 608 is broken, for example by removing a pill.

Each track 608 can be seen as lying between a pair of two coupling pads 614 (with one coupling pad 614 being common to all tracks 608). In this example, the coupling pads 614 comprise a first layer of conductive ink (for example, an ink comprising carbon or metallic particles, or the like) and a second layer. The second layer comprises a dielectric material, which may be a printed dielectric layer, for example polyethylene. Each coupling pad 614 is to form a capacitive connection with a monitoring apparatus. Thus, in this example, the packaging is printed to provide ten monitored circuits, provided by the ten tracks.

For example a pad may have a radius of about 3 mm and a surface area of $A=25$ mm$^2$. The presence of a dielectric layer means that a capacitive connection may be formed between the blister pack 604 and monitor 600 when in contact as the dielectric layer provides a spacing between a coupling pad 614 and the couplings 610. Such a gap (i.e. the depth of the dielectric layer) in an example may be around $d=4$ μm. Assuming a dielectric material of polyethylene with dielectric constant $\varepsilon=2.25$, and the vacuum permittivity: $\varepsilon_0=8.8541878176\ldots\times 10^{-12}$ F/m and the surface area of the pads 614 is matched by an adjacent surface area of a coupling 610, this results in an estimated capacitance for each coupling of $C=(\varepsilon\times\varepsilon_0\times A)/d=6$ pF.

In some examples, this determined value may be used as the value for C for the circuit. In other examples, C may be determined and used to determine the resistance R of each track 608, or the effect of the capacitance reduced in determining the resistance R of each track 608. Determining or effectively substantially negating the capacitance of the couplings allows any mis-alignment between pads (effectively reducing the value of A), changes in the dielectric constant of the dielectric layer, variations in the thickness thereof, or the presence of an additional gap (e.g. an airgap) to be taken into account.

The blister pack monitor 600 comprises a securing element 602 (in this example, a slot providing a substantially interference fit) to secure rhw blister pack 604. In some examples, the securing element 602 may comprise a clamp or a clip or the like to secure the blister pack 604 with a gripping force, which may in some examples be applied and removed. In other examples, the securing element 602 may for example comprise an adhesive, or a coupling material such as part of a 'hook and loop' fastening, with the corresponding part being provided on a blister pack 604. In other examples, the blister pack 604 may comprises an element, such as a ridge or a hole, which interacts with or receives at least part of a securing element. Other examples of securing elements may be provided.

The blister pack monitor 600 further comprises in this example eleven couplings 610 which provide an electrical coupling with a monitoring track 608 of a secured blister pack 604. It will be noted that a first coupling 610 is associated with each track 608, (i.e. ten such couplings are provided), whereas a second coupling 610 is shared and would be used to interrogate each of the tracks 608 and electronic monitoring apparatus 612 to determine a status of the monitoring track. In other words, in this example, there is one coupling 610 for each track 608, and one additional coupling 610.

Each coupling 610 may comprise a continuous connection pad (for example as described in relation to FIGS. 1A and 1B) or a plurality of galvanically separated connection elements as discussed above with reference to FIGS. 2-4. The surface area of a coupling may be substantially equal to the area of a pad 614. In some examples, the surface area may be larger or smaller than that of a pad 614, to allow for a mis-alignment or changes in alignment between a pad 614 and the coupling 610 without changes in capacitance. In the case that the couplings 610 are divided into separated connection elements, the value of A for each capacitive coupling formed is correspondingly reduced (for example, for well aligned pads 614 and couplings 610 as described in relation to FIGS. 2 and 3, the area A of each connection element would be slightly less than half the value of the surface area of the pads 614).

The couplings 610 in this example are arranged in a 'triangle packing' arrangement, in which rows of the couplings are offset. This allows a relatively close packing, which in turn allows the volume of the couplings 610 to be increased, which has the effect of increasing the capacitance of each coupling 610 compared to a smaller coupling 610.

Some but not all of the storage volumes 606, tracks 608, couplings 610 and pads 614 are labelled to avoid overcomplicating the Figure.

The electronic monitoring apparatus 612 may determine the status of each of a plurality of monitoring tracks 608 (i.e. whether the track is complete or interrupted), each of the tracks 608 being associated with a different storage volume 606. An interrupted track may be indicative of a pill having been dispensed. For example, the electronic monitoring apparatus 612 may operate according to the principles set out in relation to any of FIGS. 1 to 4. The methods may be carried out in relation to each track 608 in turn.

In examples, the blister pack monitor 600 may comprise additional components, for example a communication port or facility to allow the status of a track to be communicated, for example by wireless or wired communication. The blister pack monitor 600 may also comprise, for example, an alarm (such as sound or light) to alert a patient that a pill should be dispensed, and breaking the track may silence the alarm.

In some examples, a blister pack monitor 600 may comprise a plurality of couplings 610 to provide an electrical connection to each of a plurality of monitoring tracks 608, and in which the number of couplings is less than the number of monitoring tracks.

Figure 7:
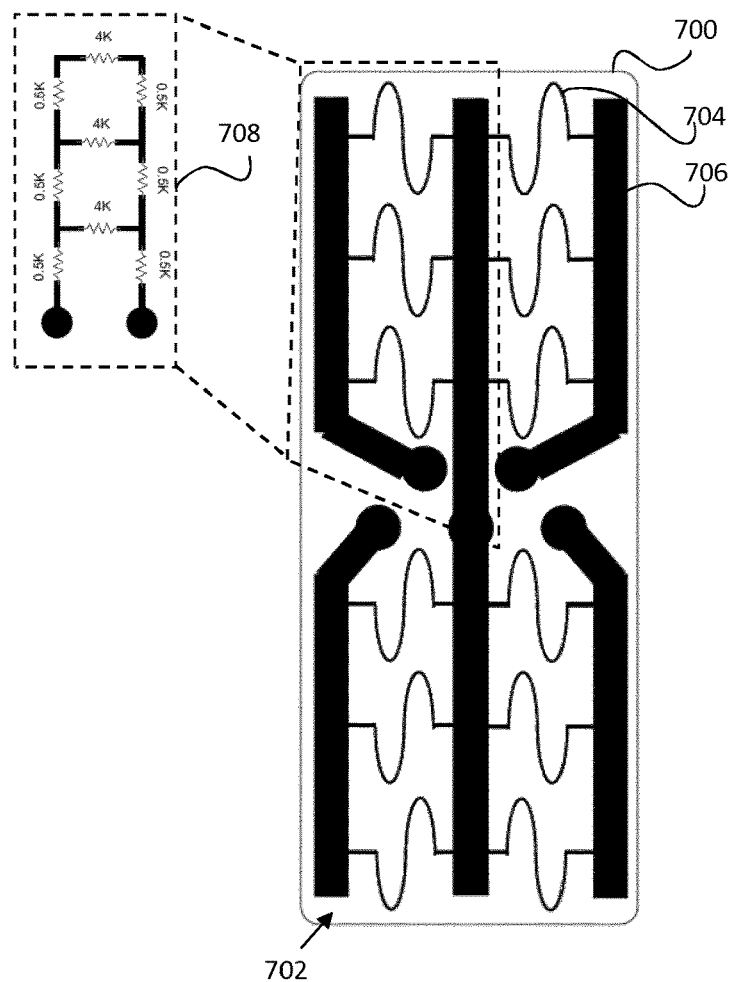
FIG. 7 is a simplified schematic diagram of an example blister pack.

In such an example, as is illustrated in relation to FIG. 7, a blister pack 700 may be provided with tracks which are interconnected to form a network 702. For example, the tracks have a relatively high resistance portion 704 associated with a storage volume and a relatively low resistance portion 706 associated with a joining section. For example, the tracks may be printed with conductive inks (such as ink comprising carbon-nanotubes), in which narrower traces will exhibit higher resistance. Different resistance levels may for example be achieve by either/both of printing with different widths and different thickness of the layer (for example by printing multiple layers of a conductive ink). In the example of FIG. 7, each network 702 may provide a monitored circuit, and the blister pack 700 is printed with four monitored circuits.

For the sake of example, the relatively high resistance portions 704 may have a resistance of around 4KΩ, and the relatively low resistance portions 706 may have a resistance of around 0.5KΩ, as is represented by the equivalent circuit 708 showing three monitored tracks (monitoring three storage volumes), which may be monitored within a single monitored circuit.

For these three storage volumes, there may be 8 combinations with resistance values. For the sake of example, a 0 is used to indicate that a storage volume has been accessed (e.g. a pill has been removed) and a 1 indicates that the track is intact and the pill remains in the storage volume:

| Pills | Total Resistance [ohms] |
|-------|-------------------------|
| 000   | Infinite                |
| 001   | 7.0K                    |
| 010   | 6.0K                    |
| 011   | 4.2K                    |
| 100   | 5.0K                    |
| 101   | 3.4K                    |
| 110   | 3.2K                    |
| 111   | 2.8K                    |

As can be seen, if the resistance can be sufficiently accurately determined, it is possible to know how many storage volumes have been accessed are out and even to know which of the storage volumes has been accessed with just two couplings. In total, the status of all 12 of the storage volumes of a blister pack 700 arranged as shown in FIG. 7 can be determined with just five couplings (i.e. the packaging as shown provides four distinct monitored circuits). Providing fewer couplings may reduce the complexity of an apparatus. In this example, the difference between the resistance values is relatively small. A pack 700 arranged according to the principles illustrated in FIG. 7 may be combined with the methods and principles described above in relation to FIG. 1-4.

Figure 8:
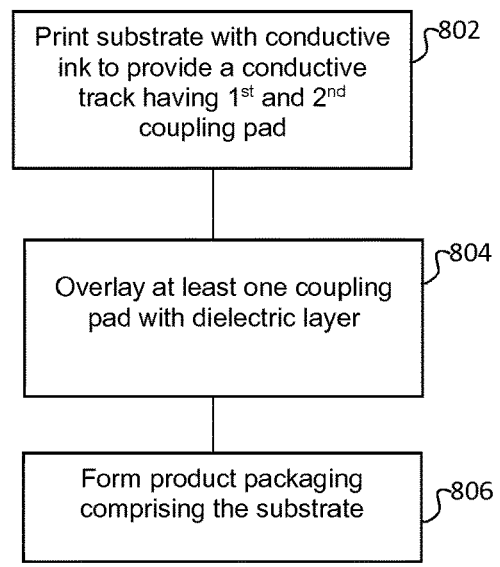
FIG. 8 is a flowchart of an example method of determining the resistance of a monitored circuit.

FIG. 8 is an example of a method. The method comprises, in block 802, printing a substrate with conductive ink to provide a conductive track having a first and second coupling pad. The coupling pads may extend over a region of the substrate and may be to form a capacitive coupling with monitoring circuitry. In block 804, the connection pads are overlaid or coated with a dielectric layer. In some examples, the dialectic layer may comprise a flexible material, for example comprising a polymer, for example polyethylene. Such polymers are inexpensive and may allow the substrate on which it is printed/applied to flex. In some examples, the dielectric may comprises a rigid material (for example, comprising a ceramic) or semi-rigid, for example to add rigidity to the substrate. In some examples, the dielectric layer may be printed over some or all of the substrate, or at least part of the substrate may be encapsulated or coated with a dielectric In block 806, a product packaging comprising the substrate is formed, the product packaging comprising a storage volume such that the interior of the storage volume cannot be accessed unless the conductive track is broken.

The steps may be carried out in a different order to that presented in the flow chart. For example, the substrate may be incorporated into the packaging before it is printed.

The method may be a method for forming packaging as shown in FIG. 5, 6 or 7.

As has been noted above, overlaying with a dielectric layer provides protection to the underlying connection pad, protecting it from damage. In addition, the dielectric layer may effectively define a gap between the plates of a parallel plate capacitor. This means that the monitoring apparatus and the substrate may be brought into contact while a gap is maintained, which may in turn allow a more stable connection—both physically and electrically—to be formed. This in turn means that a monitoring apparatus is more likely to be capable of successfully coupling with the packaging. In examples in which the dielectric layer is printed, this may be carried out in line with a printing process and therefore need not unduly complicate a packaging manufacturing process.

Some aspects of examples in the present disclosure can be provided as methods, systems or may utilise machine readable instructions, such as any combination of software, hardware, firmware or the like. Such machine readable instructions may be included on a computer readable storage medium (including but is not limited to disc storage, CD-ROM, optical storage, etc.) having computer readable program codes therein or thereon. Such instructions may be executed by the processing circuitry 118.

The present disclosure is described with reference to flow charts and/or block diagrams of the method, devices and systems according to examples of the present disclosure. Although the flow diagrams described above show a specific order of execution, the order of execution may differ from that which is depicted.

The machine readable instructions may, for example, be executed by a general purpose computer, a special purpose computer, an embedded processor or processors of other programmable data processing devices to realize the functions described in the description and diagrams. In particular, a processor or processing apparatus may execute the machine readable instructions. Thus the processing circuitry 118 may be implemented by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine readable instructions may also be stored in a computer readable storage that can guide the computer or other programmable data processing devices to operate in a specific mode.

Such machine readable instructions may also be loaded onto a computer or other programmable data processing devices, so that the computer or other programmable data processing devices perform a series of operations to produce computer-implemented processing Further, some teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. Monitoring circuitry comprising:
   a first coupling and a second coupling, wherein at least one of the first coupling and the second coupling is to capacitively couple the monitoring circuitry to a monitored circuit on a product packaging, the monitored circuit having a resistance and wherein the resistance of the monitored circuit is indicative of a status of a product stored in the product packaging, and the monitored circuit is to be connected in series between the first coupling and the second coupling; and
   monitoring apparatus to determine the resistance of the monitored circuit via the first coupling and the second coupling;
   wherein at least one of the first coupling and the second coupling of the monitoring circuitry comprises two galvanically separated connection elements, wherein the galvanically separated connection elements are to capacitively couple with a common coupling pad of the monitored circuit; and
   wherein the two galvanically separated connection elements together have a collective surface area which is substantially the same as a surface area of the common coupling pad.

2. Monitoring circuitry according to claim 1 wherein the monitoring apparatus is to determine a capacitance of at least one capacitive coupling formed between the monitoring circuitry and the monitored circuit.

3. Monitoring circuitry according to claim 2 which comprises an alternating voltage source which is to supply an alternating voltage at a first frequency and an alternating voltage at a second frequency, wherein the monitoring circuitry is to measure an alternating current in the monitored circuit, and to use the measured current to determine the capacitance of at least one capacitive coupling formed between the monitoring circuitry and the monitored circuit.

4. Monitoring circuitry according to claim 2 in which at least one of the first coupling and the second coupling comprises a first, second and third connection element, wherein the first, second and third connection elements are galvanically separated from one another and at least one of the first coupling and the second coupling is to capacitively couple with a common coupling pad of the monitored circuit, and
   the monitoring apparatus is to determine:
   a first capacitance between the first connection element and the second connection element via the common coupling pad,
   a second capacitance between the second connection element and the third connection element via the common coupling pad, and
   a third capacitance between the first connection element and the third connection element via the common coupling pad;
   and to use the first, second and third capacitances to determine a connection capacitance between the coupling and the common coupling pad of the monitored circuit.

5. Monitoring circuitry according to claim 1 in which each of the first coupling and the second coupling comprises a first connection element and a second connection element, wherein the first and second connection elements are galvanically separated, and wherein the first and second connection element of each coupling are to capacitively couple with a common coupling pad of the monitored circuit; and
   the monitoring apparatus is to determine:
   a first impedance of a circuit formed between the first connection element and the second connection element of the first coupling via the common coupling pad;
   a second impedance of a circuit formed between the first connection element and the second connection element of the second coupling via the common coupling pad;
   a third impedance of a circuit formed between the first connection element of the first coupling and the first connection element of the second coupling via the monitored circuit;
   a fourth impedance of a circuit formed between the second connection element of the first coupling and second connection element of the second coupling via the monitored circuit;
   a fifth impedance of a circuit formed between the first connection element of the first coupling and the second connection element of the second coupling via the monitored circuit; and
   a sixth impedance of a circuit formed between the second connection element of the first coupling and the first connection element of the second coupling via the monitored circuit.

6. Monitoring circuitry according to claim 1 further comprising an alternating voltage source to supply an alternating current of a variable frequency, and
   the monitoring apparatus is to determine, for each of a plurality of frequencies, an impedance of a circuit formed between the first coupling and the second coupling via the monitored circuit;
   to determine a frequency threshold above which, for a predetermined frequency difference, the measured impedance changes by less than a predetermined amount; and
   to measure the resistance of the monitored circuit when a current of at least the threshold frequency is applied thereto.

7. Monitoring circuitry according to claim 1 further comprising a securing element to secure a blister pack comprising at least one storage volume and at least one monitoring track which is interrupted to provide access to an interior of the storage volume, the monitoring track having a resistance.

8. Monitoring circuitry comprising:
   a first coupling and a second coupling, wherein at least one of the first coupling and the second coupling is to capacitively couple the monitoring circuitry to a monitored circuit on a product packaging, the monitored circuit having a resistance and wherein the resistance of the monitored circuit is indicative of a status of a product stored in the product packaging, and the monitored circuit is to be connected in series between the first coupling and the second coupling; and
   monitoring apparatus to determine the resistance of the monitored circuit via the first coupling and the second coupling;

wherein each of the first coupling and the second coupling comprises a first connection element and a second connection element, wherein the first and second connection elements are galvanically separated, and wherein the first and second connection element of each coupling are to capacitively couple with a common coupling pad of the monitored circuit; and the monitoring apparatus is to determine:

a first impedance of a circuit formed between the first connection element and the second connection element of the first coupling via the common coupling pad;

a second impedance of a circuit formed between the first connection element and the second connection element of the second coupling via the common coupling pad;

a third impedance of a circuit formed between the first connection element of the first coupling and the first connection element of the second coupling via the monitored circuit;

a fourth impedance of a circuit formed between the second connection element of the first coupling and second connection element of the second coupling via the monitored circuit;

a fifth impedance of a circuit formed between the first connection element of the first coupling and the second connection element of the second coupling via the monitored circuit; and a sixth impedance of a circuit formed between the second connection element of the first coupling and the first connection element of the second coupling via the monitored circuit.

\* \* \* \* \*